United States Patent
Koike

(10) Patent No.: US 9,214,821 B2
(45) Date of Patent: Dec. 15, 2015

(54) CHARGE/DISCHARGE CONTROL CIRCUIT AND BATTERY DEVICE

(71) Applicant: Seiko Instruments Inc., Chiba-shi, Chiba (JP)

(72) Inventor: Toshiyuki Koike, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 143 days.

(21) Appl. No.: 14/173,496

(22) Filed: Feb. 5, 2014

(65) Prior Publication Data

US 2014/0217988 A1 Aug. 7, 2014

(30) Foreign Application Priority Data

Feb. 6, 2013 (JP) ................... 2013-021630

(51) Int. Cl.
*H02J 7/00* (2006.01)
*G01R 31/36* (2006.01)

(52) U.S. Cl.
CPC .............. *H02J 7/0031* (2013.01); *H02J 7/0021* (2013.01); *G01R 31/362* (2013.01); *H02J 2007/004* (2013.01); *H02J 2007/0037* (2013.01); *H02J 2007/0039* (2013.01)

(58) Field of Classification Search
CPC ................... H02J 2007/004; H02J 2007/0037; H02J 2007/0039; H02J 7/0072
USPC ........................................................ 320/134
See application file for complete search history.

(56) References Cited

U.S. PATENT DOCUMENTS

| | | | | |
|---|---|---|---|---|
| 6,060,904 A * | 5/2000 | Shimoda | ........................ | 326/68 |
| 6,433,582 B2 * | 8/2002 | Hirano | ............................ | 326/68 |
| 6,489,836 B2 * | 12/2002 | Yeong | ........................... | 327/541 |
| 6,501,248 B2 * | 12/2002 | Fujiwara | ...................... | 320/136 |
| 6,747,502 B2 * | 6/2004 | Yamamoto | .................... | 327/333 |
| 6,856,523 B2 * | 2/2005 | Griffin | ........................ | 363/21.1 |
| 7,183,832 B1 * | 2/2007 | Voo | ................. | 327/333 |
| 7,212,033 B2 * | 5/2007 | Subramania | .................... | 326/68 |
| 7,511,552 B2 * | 3/2009 | Ali et al. | ........................ | 327/333 |
| 7,710,183 B2 * | 5/2010 | Chaba et al. | ................... | 327/333 |
| 7,750,717 B2 * | 7/2010 | Ali et al. | ........................ | 327/333 |
| 7,994,819 B2 * | 8/2011 | Al-Shyoukh et al. | ........... | 326/68 |
| 8,384,355 B2 * | 2/2013 | Koike et al. | .................... | 320/132 |
| 8,618,774 B2 * | 12/2013 | Maetani | ........................ | 320/134 |
| 8,643,340 B1 * | 2/2014 | Kamath | ........................ | 320/138 |
| 8,922,472 B2 * | 12/2014 | Yamamoto et al. | ........... | 345/100 |

* cited by examiner

*Primary Examiner* — Sun Lin
(74) *Attorney, Agent, or Firm* — Brinks Gilson & Lione

(57) ABSTRACT

The level shifter circuit includes: a first transistor including a gate connected to an input terminal of the level shifter circuit and a source connected to a first power supply terminal; a first resistor including one terminal connected to the input terminal of the level shifter circuit; a second transistor including a gate connected to another terminal of the first resistor, a drain connected to a drain of the first transistor, and a source connected to a terminal for inputting the voltage subjected to the level conversion; and a third transistor including a gate and a drain connected to the another terminal of the first resistor, and a source connected to the terminal for inputting the voltage subjected to the level conversion. Further, the battery device includes the charge/discharge control circuit.

4 Claims, 4 Drawing Sheets

US 9,214,821 B2

CHARGE/DISCHARGE CONTROL CIRCUIT AND BATTERY DEVICE

RELATED APPLICATIONS

This application claims priority under 35 U.S.C. §119 to Japanese Patent Application No. 2013-021630 filed on Feb. 6, 2013, the entire content of which is hereby incorporated by reference.

BACKGROUND OF THE INVENTION

1. Field of the Invention

The present invention relates to a charge/discharge control circuit for detecting a voltage and an abnormality of a secondary battery, and a battery device including the charge/discharge control circuit. In particular, the present invention relates to a charge/discharge control circuit that includes a built-in level shifter circuit for converting a low voltage signal to a high voltage signal for positive and negative terminals, and a battery device including the charge/discharge control circuit.

2. Description of the Related Art

FIG. 4 illustrates a circuit diagram of a related-art battery device including a charge/discharge control circuit. The related-art battery device including the charge/discharge control circuit includes a secondary battery 1, a control circuit 2 for monitoring a voltage of the secondary battery 1, PMOS transistors 401, 408, and 409, NMOS transistors 402 and 410, an inverter 407, a switch circuit 3 for controlling charge and discharge of the secondary battery 1, an external terminal 4 and an external terminal 5 to be connected to a charger 8 or a load 9, a level shifter circuit 74, a pull-down resistor 411, a VDD terminal, a VSS terminal, a charge control terminal 13, a discharge control terminal 12, and an overcurrent detection terminal 14.

The level shifter circuit 74 includes PMOS transistors 403 and 405 and NMOS transistors 404 and 406. The switch circuit 3 includes a discharge control switch 10 and a charge control switch 11.

The control circuit 2 monitors the voltage of the secondary battery 1. When the charger 8 is connected and the battery voltage of the secondary battery 1 becomes an overcharged state, the control circuit 2 outputs a signal of High so that the discharge control switch 10 may be turned on, and outputs a signal of High so that the charge control switch 11 may be turned off. In this way, a charge current from the charger 8 is interrupted to stop the charge to the secondary battery 1. When the load 9 is connected and the voltage of the secondary battery 1 becomes an overdischarged state, the control circuit 2 outputs a signal of Low so that the discharge control switch 10 may be turned off, and outputs a signal of Low so that the charge control switch 11 may be turned on. In this way, a discharge current to the load 9 is interrupted to stop the discharge of the secondary battery 1.

As described above, when the secondary battery 1 is overcharged or overdischarged, the discharge control switch 10 or the charge control switch 11 is controlled, thereby being capable of stopping the charge current or the discharge current (see, for example, FIG. 1 of Japanese Patent Application Laid-open No. Hei 10-225007).

In the related art, however, there is a problem in that, when a transistor having a low gate breakdown voltage is used for the level shifter circuit 74, the transistor may be broken when the charger is connected. Further, there is another problem in that, when a MOS transistor having a high breakdown voltage structure is used in order to prevent the breakdown at the time of connection of the charger, the area of the MOS transistor may increase to increase a layout area.

SUMMARY OF THE INVENTION

The present invention has been devised in order to solve the above-mentioned problems, and provides a charge/discharge control circuit and a battery device that are capable of reducing a layout area, in which any MOS transistor used in a level shifter circuit is prevented from being broken when a charger is connected.

In order to solve the conventional problems, a battery device including a charge/discharge control circuit according to one embodiment of the present invention has the following configuration.

The charge/discharge control circuit includes a level shifter circuit for level-converting a voltage of a charge control signal output from a control circuit for monitoring a voltage of a secondary battery. The level shifter circuit includes: a first transistor of a first conductivity type, including a gate connected to an input terminal of the level shifter circuit and a source connected to a first power supply terminal; a first resistor including one terminal connected to the input terminal of the level shifter circuit; a second transistor of a second conductivity type, including a gate connected to another terminal of the first resistor, a drain connected to a drain of the first transistor, and a source connected to a terminal for inputting the voltage subjected to the level conversion; and a third transistor of the second conductivity type, including a gate and a drain connected to the another terminal of the first resistor, and a source connected to the terminal for inputting the voltage subjected to the level conversion. The present invention further provides a battery device including the charge/discharge control circuit.

According to the battery device including the charge/discharge control circuit according to one embodiment of the present invention, any MOS transistor used in the level shifter circuit can be prevented from being broken when a charger is connected. Besides, there is another effect that an element having a small area of the MOS transistor can be used to reduce the layout area.

DETAILED DESCRIPTION OF THE PREFERRED EMBODIMENTS

Now, embodiments of the present invention are described with reference to the accompanying drawings.

First Embodiment

Figure 1:
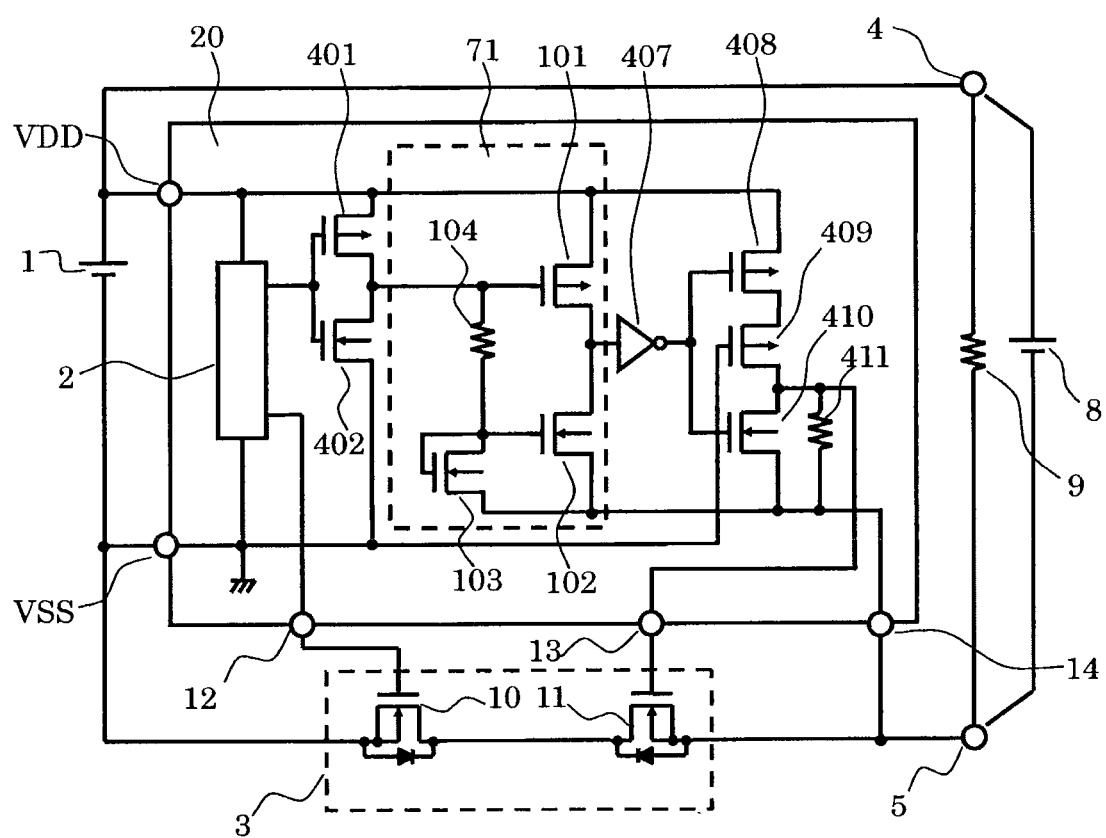
FIG. 1 is a circuit diagram of a battery device including a charge/discharge control circuit according to a first embodiment of the present invention.

FIG. 1 is a circuit diagram of a battery device including a charge/discharge control circuit according to a first embodiment of the present invention. The battery device including the charge/discharge control circuit according to the first embodiment includes a charge/discharge control circuit 20, a secondary battery 1, a switch circuit 3 for controlling charge and discharge of the secondary battery 1, and an external terminal 4 and an external terminal 5 to be connected to a charger 8 or a load 9.

The charge/discharge control circuit 20 includes a control circuit 2 for monitoring a voltage of the secondary battery 1, PMOS transistors 401, 408, and 409, NMOS transistors 402 and 410, a level shifter circuit 71, an inverter 407, a pull-down resistor 411, a VDD terminal, a VSS terminal, a charge control terminal 13, a discharge control terminal 12, and an overcurrent detection terminal 14.

The level shifter circuit 71 includes NMOS transistors 102 and 103, a PMOS transistor 101, and a resistor 104. The switch circuit 3 includes a discharge control switch 10 and a charge control switch 11.

The secondary battery 1 has a positive terminal connected to the VDD terminal and the external terminal 4, and a negative terminal connected to the VSS terminal and a source and a back gate of the discharge control switch 10. The control circuit 2 has a first input terminal connected to the VDD terminal, a second input terminal connected to the VSS terminal, a first output terminal connected to a gate of the PMOS transistor 401 and a gate of the NMOS transistor 402, and a second output terminal connected to the discharge control terminal 12. The PMOS transistor 401 has a source connected to the VDD terminal, and a drain connected to one terminal of the resistor 104 and a gate of the PMOS transistor 101. The NMOS transistor 402 has a source connected to the VSS terminal, and a drain connected to the gate of the PMOS transistor 101. The NMOS transistor 103 has a gate and a drain connected to the other terminal of the resistor 104, and a source connected to the overcurrent detection terminal 14. The PMOS transistor 101 has a source connected to the VDD terminal, and a drain connected to an input of the inverter 407 and a drain of the NMOS transistor 102. The NMOS transistor 102 has a gate connected to the gate of the NMOS transistor 103, and a source connected to the overcurrent detection terminal 14. The PMOS transistor 408 has a gate connected to an output of the inverter 407 and a gate of the NMOS transistor 410. The PMOS transistor 408 has a drain connected to a source of the PMOS transistor 409, and a source connected to the VDD terminal. The PMOS transistor 409 has a gate connected to the VSS terminal, and a drain connected to a drain of the NMOS transistor 410, one terminal of the pull-down resistor 411, and the charge control terminal 13. The NMOS transistor 410 has a source connected to the overcurrent detection terminal 14. The other terminal of the pull-down resistor 411 is connected to the overcurrent detection terminal 14. The discharge control switch 10 has a gate connected to the discharge control terminal 12, and a drain connected to a drain of the charge control switch 11. The charge control switch 11 has a gate connected to the charge control terminal 13, and a source and a back gate connected to the external terminal 5 and the overcurrent detection terminal 14.

The control circuit 2 operates with the voltage of the secondary battery 1 to monitor the voltage of the secondary battery 1. When the voltage of the secondary battery 1 is lower than an overcharge voltage, the control circuit 2 outputs a signal of High to the first output terminal and the second output terminal, to thereby turn off the PMOS transistor 401, turn on the NMOS transistor 402, and turn on the discharge control switch 10. A signal of Low is output from the NMOS transistor 402, and hence the PMOS transistor 101 is turned on and the NMOS transistor 102 is turned off, and a signal of High is input to the inverter 407. In response to this signal, the inverter 407 outputs a signal of Low to turn on the PMOS transistor 408 and turn off the NMOS transistor 410. The PMOS transistor 409 is in an ON state, and hence a signal of High is output to the charge control terminal 13 to turn on the charge control switch 11. In this way, the battery device operates to permit a charge current to enable the charge.

When the voltage of the secondary battery 1 increases to be equal to or higher than the overcharge voltage, the control circuit 2 outputs a signal of Low to the first output terminal and a signal of High to the second output terminal, to thereby turn on the PMOS transistor 401 and turn off the NMOS transistor 402. A signal of High is output from the NMOS transistor 401 to turn off the PMOS transistor 101 and turn on the NMOS transistor 102, and hence a signal of Low is input to the inverter 407. In response to this signal, the inverter 407 outputs a signal of High to turn off the PMOS transistor 408 and turn on the NMOS transistor 410. The PMOS transistor 409 is in the ON state, and hence a signal of Low is output to the charge control terminal 13 to turn off the charge control switch 11. In this way, the battery device operates to interrupt the charge current to inhibit the charge.

When the voltage of the secondary battery 1 decreases to be equal to or lower than an overdischarge voltage, the control circuit 2 outputs a signal of High to the first output terminal and a signal of Low to the second output terminal, to thereby turn off the PMOS transistor 401, turn on the NMOS transistor 402, and turn off the discharge control switch 10. A signal of Low is output from the NMOS transistor 402 to turn on the PMOS transistor 101 and turn off the NMOS transistor 102, and hence a signal of High is input to the inverter 407. In response to this signal, the inverter 407 outputs a signal of Low to turn on the PMOS transistor 408 and turn off the NMOS transistor 410. The PMOS transistor 409 is in the ON state, and hence a signal of High is output to the charge control terminal 13 to turn on the charge control switch 11. In this way, the battery device operates to interrupt a discharge current to inhibit the discharge.

When the voltage of the secondary battery 1 further decreases to be lower than a threshold of the PMOS transistor 409, the PMOS transistor 409 is turned off, and a signal of Low is output to the charge control terminal 13 to turn off the charge control switch 11. In this case, regardless of the output of the control circuit 2, a signal of Low is output to the charge control terminal 13 to turn off the charge control switch 11. In this way, the battery device operates to interrupt the charge current to inhibit the charge.

When the charge control switch 11 is turned off, an open circuit voltage of the charger 8 is applied between the external terminal 4 and the external terminal 5. Thus, it is necessary to prevent the gates of the NMOS transistors 102 and 103 of the level shifter circuit 71 from being broken by the open circuit voltage. A current of the charger 8 flows to the external terminal 5 via the PMOS transistor 401, the resistor 104, the NMOS transistor 103, and the overcurrent detection terminal 14. Accordingly, the open circuit voltage of the charger 8 is divided by an ON-state resistance of the PMOS transistor 401, a resistance of the resistor 104, and an ON-state resistance of the NMOS transistor 103. Thus, by adjusting the resistor 104, a gate-source voltage of the NMOS transistor 103 can be set to be equal to or lower than a breakdown voltage.

The open circuit voltage of the charger is represented by VCHA; the ON-state resistance value of the PMOS transistor 401, RON (401); the resistance value of the resistor 104, R104; the ON-state resistance value of the NMOS transistor 103, RON (103); and a gate-source breakdown voltage of the NMOS transistors 102 and 103, VGSS. Then, by setting the gate-source breakdown voltage of the NMOS transistors 102 and 103 as follows, the breakdown of the NMOS transistors 102 and 103 can be prevented.

$$VCHA \times RON(103)/(RON(401)+R104+RON(103)) < VGSS \qquad (1)$$

The gate-source voltage of the NMOS transistor 103 is equal to the gate-source voltage of the NMOS transistor 102, and hence the gate-source voltage of the NMOS transistor 102 can also be set to be equal to or lower than a breakdown voltage. In this way, the open circuit voltage is not applied to the gates of the NMOS transistors 102 and 103. Consequently, the level shifter circuit 71 can be constructed by using transistors having a low gate-source breakdown voltage.

As described above, by adjusting the resistor 104, the gates of the NMOS transistors 102 and 103 can be prevented from being applied with a voltage equal to or higher than the gate-source breakdown voltage. Consequently, even when a MOS transistor to be used has any level of the gate-source breakdown voltage, the MOS transistor can be prevented from being broken when the charger is connected. Besides, there is another effect that an element having a small area of the MOS transistor can be used to reduce the layout area.

Second Embodiment

Figure 2:
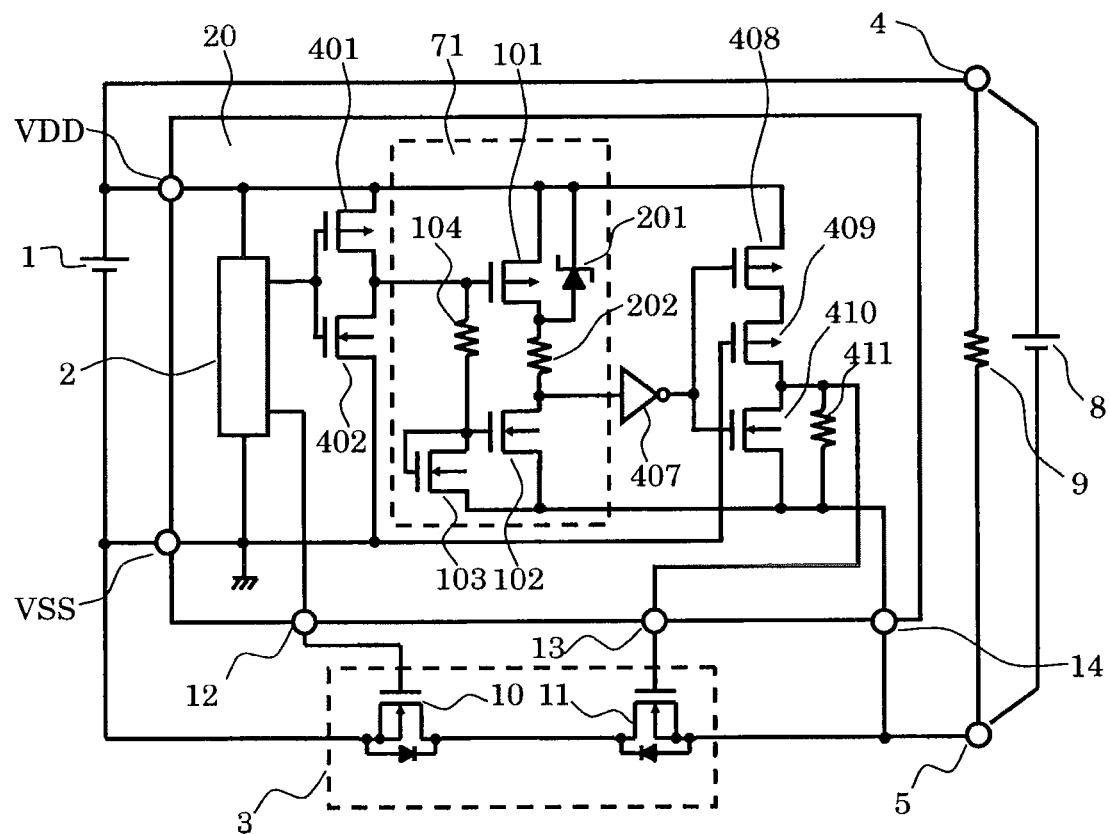
FIG. 2 is a circuit diagram of a battery device including a charge/discharge control circuit according to a second embodiment of the present invention.

FIG. 2 is a circuit diagram of a battery device including a charge/discharge control circuit according to a second embodiment of the present invention. The second embodiment is different from the first embodiment in that a Zener diode 201 and a resistor 202 are added. Connections are made as follows. An anode of the Zener diode 201 is connected to the drain of the PMOS transistor 101, and a cathode of the Zener diode 201 is connected to the source thereof. One terminal of the resistor 202 is connected to the drain of the PMOS transistor 101, and the other terminal thereof is connected to the drain of the NMOS transistor 102 and the input of the inverter 407. The other connections are the same as those of FIG. 1.

The control circuit 2 operates with the voltage of the secondary battery 1 to monitor the voltage of the secondary battery 1. When the voltage of the secondary battery 1 is lower than an overcharge voltage, the control circuit 2 outputs a signal of High to the first output terminal and the second output terminal, to thereby turn off the PMOS transistor 401, turn on the NMOS transistor 402, and turn on the discharge control switch 10. A signal of Low is output from the NMOS transistor 402, and hence the PMOS transistor 101 is turned on and the NMOS transistor 102 is turned off, and a signal of High is input to the inverter 407. In response to this signal, the inverter 407 outputs a signal of Low to turn on the PMOS transistor 408 and turn off the NMOS transistor 410. The PMOS transistor 409 is in an ON state, and hence a signal of High is output to the charge control terminal 13 to turn on the charge control switch 11. In this way, the battery device operates to permit a charge current to enable the charge.

When the voltage of the secondary battery 1 increases to be equal to or higher than the overcharge voltage, the control circuit 2 outputs a signal of Low to the first output terminal and a signal of High to the second output terminal, to thereby turn on the PMOS transistor 401 and turn off the NMOS transistor 402. A signal of High is output from the NMOS transistor 401 to turn off the PMOS transistor 101 and turn on the NMOS transistor 102, and hence a signal of Low is input to the inverter 407. In response to this signal, the inverter 407 outputs a signal of High to turn off the PMOS transistor 408 and turn on the NMOS transistor 410. The PMOS transistor 409 is in the ON state, and hence a signal of Low is output to the charge control terminal 13 to turn off the charge control switch 11. In this way, the battery device operates to interrupt the charge current to inhibit the charge.

When the voltage of the secondary battery 1 decreases to be equal to or lower than an overdischarge voltage, the control circuit 2 outputs a signal of High to the first output terminal and a signal of Low to the second output terminal, to thereby turn off the PMOS transistor 401, turn on the NMOS transistor 402, and turn off the discharge control switch 10. A signal of Low is output from the NMOS transistor 402 to turn on the PMOS transistor 101 and turn off the NMOS transistor 102, and hence a signal of High is input to the inverter 407. In response to this signal, the inverter 407 outputs a signal of Low to turn on the PMOS transistor 408 and turn off the NMOS transistor 410. The PMOS transistor 409 is in the ON state, and hence a signal of High is output to the charge control terminal 13 to turn on the charge control switch 11. In this way, the battery device operates to interrupt a discharge current to inhibit the discharge.

When the voltage of the secondary battery 1 further decreases to be lower than a threshold of the PMOS transistor 409, the PMOS transistor 409 is turned off, and a signal of Low is output to the charge control terminal 13 to turn off the charge control switch 11. In this case, regardless of the output of the control circuit 2, a signal of Low is output to the charge control terminal 13 to turn off the charge control switch 11. In this way, the battery device operates to interrupt the charge current to inhibit the charge.

When the charge control switch 11 is turned off, an open circuit voltage of the charger 8 is applied between the external terminal 4 and the external terminal 5. Thus, it is necessary to prevent the gates of the NMOS transistors 102 and 103, the drain of the NMOS transistor 102, and the drain of the PMOS transistor 101 of the level shifter circuit 71 from being broken by the open circuit voltage. A current of the charger 8 flows to the external terminal 5 via the PMOS transistor 401, the resistor 104, the NMOS transistor 103, and the overcurrent detection terminal 14. Accordingly, the open circuit voltage of the charger 8 is divided by an ON-state resistance of the PMOS transistor 401, a resistance of the resistor 104, and an ON-state resistance of the NMOS transistor 103. Thus, by adjusting the resistor 104, a gate-source voltage of the NMOS transistor 103 can be set to be equal to or lower than a breakdown voltage.

The open circuit voltage of the charger is represented by VCHA; the ON-state resistance value of the PMOS transistor 401, RON (401); the resistance value of the resistor 104, R104; the ON-state resistance value of the NMOS transistor 103, RON (103); and a gate-source breakdown voltage of the NMOS transistors 102 and 103, VGSS. Then, by setting the gate-source breakdown voltage of the NMOS transistors 102 and 103 as expressed by Expression 1, the breakdown of the NMOS transistors 102 and 103 can be prevented.

The gate-source voltage of the NMOS transistor 103 is equal to the gate-source voltage of the NMOS transistor 102, and hence the gate-source voltage of the NMOS transistor 102 can also be set to be equal to or lower than a breakdown voltage. In this way, the open circuit voltage is not applied to the gates of the NMOS transistors 102 and 103. Consequently, the level shifter circuit 71 can be constructed by using transistors having a low gate-source breakdown voltage.

A current of the charger 8 flows to the external terminal 5 via the Zener diode 201, the resistor 202, the NMOS transistor 102, and the overcurrent detection terminal 14. Accordingly, the open circuit voltage of the charger 8 is divided by a Zener voltage of the Zener diode 201, a resistance of the resistor 202, and an ON-state resistance of the NMOS transistor 102. Thus, by adjusting the resistor 202, a gate-source voltage of the PMOS transistor 101 can be set to be equal to or lower than a breakdown voltage.

The drain-source breakdown voltage of the PMOS transistor 101 and the NMOS transistor 102 is represented by VDSS; the Zener voltage of the Zener diode 201, Vz; the resistance value of the resistor 202, R202; and the ON-state resistance of the NMOS transistor 102, RON (102). By setting Vz<VDSS, the PMOS transistor 101 can be prevented from being broken. When the charge control switch 11 is turned off, the NMOS transistor 102 can be prevented from being broken by setting the drain-source voltage thereof as follows.

$$(VCHA-Vz) \times RON(102)/(R202+RON(102)) < VDSS \quad (2)$$

It is understood from Expression 2 that, by adjusting R202, the open circuit voltage is not applied between the drain and source of the PMOS transistor 101 or between the drain and source of the NMOS transistor 102. Consequently, the level shifter circuit 71 can be constructed by using transistors having a low drain breakdown voltage.

As described above, by adjusting the resistor 104, the gates of the NMOS transistors 102 and 103 can be prevented from being applied with the open circuit voltage. Consequently, even when any MOS transistor is used, the MOS transistor can be prevented from being broken when the charger is connected. Further, by adjusting the resistor 202, the drains of the PMOS transistor 101 and the NMOS transistor 102 can be prevented from being applied with the open circuit voltage. Consequently, even when any MOS transistor is used, the MOS transistor can be prevented from being broken when the charger is connected. Besides, there is another effect that an element having a small area of the MOS transistor can be used to reduce the layout area.

Third Embodiment

Figure 3:
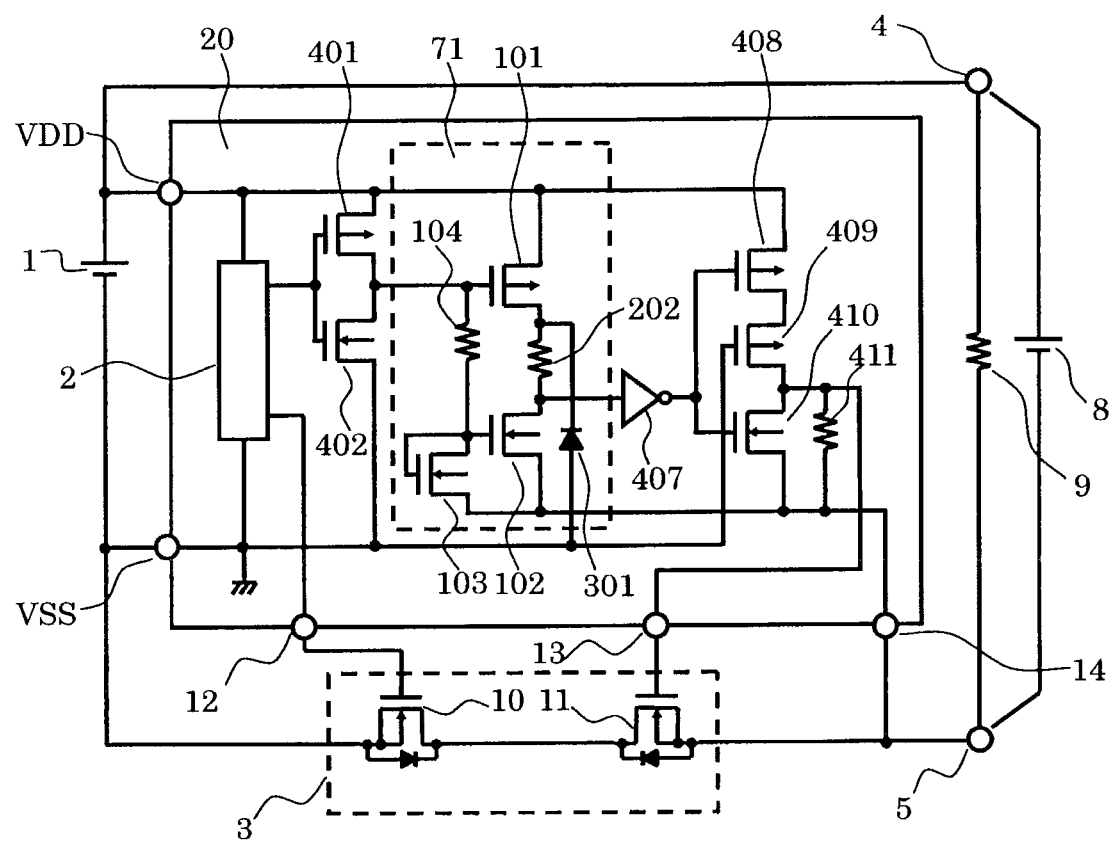
FIG. 3 is a circuit diagram of a battery device including a charge/discharge control circuit according to a third embodiment of the present invention.
Figure 4:
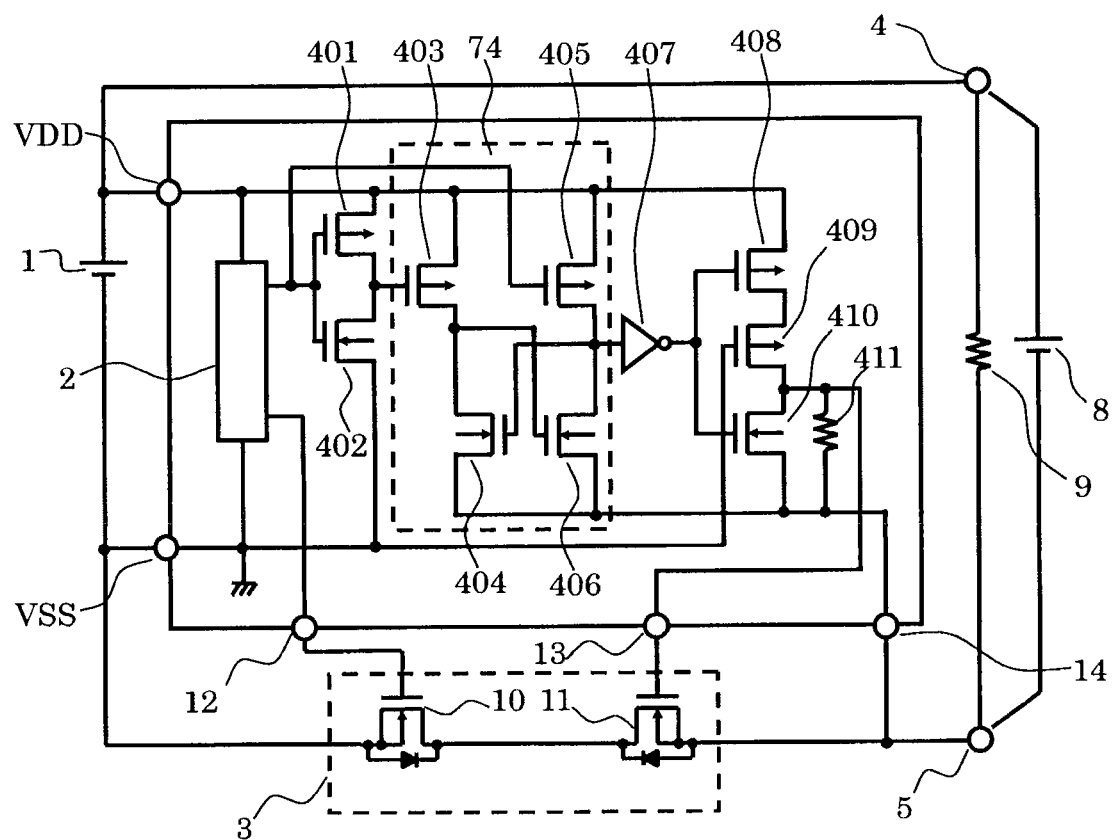
FIG. 4 is a circuit diagram of a related-art battery device including a charge/discharge control circuit.

FIG. 3 is a circuit diagram of a battery device including a charge/discharge control circuit according to a third embodiment of the present invention. The third embodiment is different from the second embodiment in that the Zener diode 201 is changed to a diode 301. Connections are made as follows. A cathode of the diode 301 is connected to the drain of the PMOS transistor 101, and an anode thereof is connected to the VSS terminal. The other connections are the same as those of FIG. 2.

The control circuit 2 operates with the voltage of the secondary battery 1 to monitor the voltage of the secondary battery 1. When the voltage of the secondary battery 1 is lower than an overcharge voltage, the control circuit 2 outputs a signal of High to the first output terminal and the second output terminal, to thereby turn off the PMOS transistor 401, turn on the NMOS transistor 402, and turn on the discharge control switch 10. A signal of Low is output from the NMOS transistor 402, and hence the PMOS transistor 101 is turned on and the NMOS transistor 102 is turned off, and a signal of High is input to the inverter 407. In response to this signal, the inverter 407 outputs a signal of Low to turn on the PMOS transistor 408 and turn off the NMOS transistor 410. The PMOS transistor 409 is in an ON state, and hence a signal of High is output to the charge control terminal 13 to turn on the charge control switch 11. In this way, the battery device operates to permit a charge current to enable the charge.

When the voltage of the secondary battery 1 increases to be equal to or higher than the overcharge voltage, the control circuit 2 outputs a signal of Low to the first output terminal and a signal of High to the second output terminal, to thereby turn on the PMOS transistor 401 and turn off the NMOS transistor 402. A signal of High is output from the NMOS transistor 401 to turn off the PMOS transistor 101 and turn on the NMOS transistor 102, and hence a signal of Low is input to the inverter 407. In response to this signal, the inverter 407 outputs a signal of High to turn off the PMOS transistor 408 and turn on the NMOS transistor 410. The PMOS transistor 409 is in the ON state, and hence a signal of Low is output to the charge control terminal 13 to turn off the charge control switch 11. In this way, the battery device operates to interrupt the charge current to inhibit the charge.

When the voltage of the secondary battery 1 decreases to be equal to or lower than an overdischarge voltage, the control circuit 2 outputs a signal of High to the first output terminal and a signal of Low to the second output terminal, to thereby turn off the PMOS transistor 401, turn on the NMOS transistor 402, and turn off the discharge control switch 10. A signal of Low is output from the NMOS transistor 402 to turn on the PMOS transistor 101 and turn off the NMOS transistor 102, and hence a signal of High is input to the inverter 407. In response to this signal, the inverter 407 outputs a signal of Low to turn on the PMOS transistor 408 and turn off the NMOS transistor 410. The PMOS transistor 409 is in the ON state, and hence a signal of High is output to the charge control terminal 13 to turn on the charge control switch 11. In this way, the battery device operates to interrupt a discharge current to inhibit the discharge.

When the voltage of the secondary battery 1 further decreases to be lower than a threshold of the PMOS transistor 409, the PMOS transistor 409 is turned off, and a signal of Low is output to the charge control terminal 13 to turn off the charge control switch 11. In this case, regardless of the output of the control circuit 2, a signal of Low is output to the charge control terminal 13 to turn off the charge control switch 11. In this way, the battery device operates to interrupt the charge current to inhibit the charge.

When the charge control switch 11 is turned off, an open circuit voltage of the charger 8 is applied between the external terminal 4 and the external terminal 5. Thus, it is necessary to prevent the gates of the NMOS transistors 102 and 103, the drain of the NMOS transistor 102, and the drain of the PMOS transistor 101 of the level shifter circuit 71 from being broken by the open circuit voltage. A current of the charger 8 flows to the external terminal 5 via the PMOS transistor 401, the resistor 104, the NMOS transistor 103, and the overcurrent detection terminal 14. Accordingly, the open circuit voltage of the charger 8 is divided by an ON-state resistance of the PMOS transistor 401, a resistance of the resistor 104, and an ON-state resistance of the NMOS transistor 103. Thus, by adjusting the resistor 104, a gate-source voltage of the NMOS transistor 103 can be set to be equal to or lower than a breakdown voltage.

The open circuit voltage of the charger is represented by VCHA; the ON-state resistance value of the PMOS transistor 401, RON (401); the resistance value of the resistor 104, R104; the ON-state resistance value of the NMOS transistor 103, RON (103); and a gate-source breakdown voltage of the NMOS transistors 102 and 103, VGSS. Then, by setting the gate-source breakdown voltage of the NMOS transistors 102 and 103 as expressed by Expression 1, the breakdown of the NMOS transistors 102 and 103 can be prevented.

The gate-source voltage of the NMOS transistor 103 is equal to the gate-source voltage of the NMOS transistor 102, and hence the gate-source voltage of the NMOS transistor 102 can also be set to be equal to or lower than a breakdown voltage. In this way, the open circuit voltage is not applied to the gates of the NMOS transistors 102 and 103. Consequently, the level shifter circuit 71 can be constructed by using transistors having a low gate breakdown voltage.

A current of the charger 8 flows to the external terminal 5 via the secondary battery 1, the diode 301, the resistor 202, the NMOS transistor 102, and the overcurrent detection terminal 14. Accordingly, the open circuit voltage of the charger 8 is divided by the voltage of the secondary battery 1, a forward voltage of the diode 301, the resistance of the resistor 202, and the ON-state resistance of the NMOS transistor 102. Thus, by adjusting the resistor 202, a drain-source voltage of the PMOS transistor 101 can be set to be equal to or lower than a breakdown voltage.

The drain-source breakdown voltage of the PMOS transistor 101 and the NMOS transistor 102 is represented by VDSS; the forward voltage of the diode 301, VF; the resistance value of the resistor 202, 8202; the ON-state resistance of the NMOS transistor 102, RON (102); and the voltage of the secondary battery 1, VBAT. By setting VF to satisfy VBAT+VF<VDSS, the PMOS transistor 101 can be prevented from being broken. When the charge control switch 11 is turned off, the NMOS transistor 102 can be prevented from being broken by setting the drain-source voltage thereof as follows.

$$(VCHA-((VBAT+VF))\times RON(102)/(R202+RON(102)) <VDSS \quad (3)$$

It is understood from Expression 3 that, by adjusting R202, the open circuit voltage is not applied between the drain and source of the PMOS transistor 101 or between the drain and source of the NMOS transistor 102. Consequently, the level shifter circuit 71 can be constructed by using transistors having a low drain breakdown voltage.

As described above, by adjusting the resistor 104, the gates of the NMOS transistors 102 and 103 can be prevented from being applied with the open circuit voltage. Consequently, even when any MOS transistor is used, the MOS transistor can be prevented from being broken when the charger is connected. Further, by adjusting the resistor 202, the drains of the PMOS transistor 101 and the NMOS transistor 102 can be prevented from being applied with the open circuit voltage. Consequently, even when any MOS transistor is used, the MOS transistor can be prevented from being broken when the charger is connected. Besides, there is another effect that an element having a small area of the MOS transistor can be used to reduce the layout area.

Note that, in the embodiments of the present invention described above, the charge and discharge of the secondary battery 1 are controlled by the switch circuit 3 connected between the VSS terminal and the external terminal 5. However, even with a configuration in which the charge and discharge of the secondary battery 1 are controlled by a switch circuit 3 connected between the VDD terminal and the external terminal 4, similar effects can be obtained by changing the conductivity type of the transistors forming the level shifter circuit 71 and changing the circuit connections correspondingly.

What is claimed is:

1. A charge/discharge control circuit for controlling charge and discharge of a secondary battery to be connected between a first terminal and a second terminal,
   wherein the charge/discharge control circuit comprises:
   a control circuit, connected between the first terminal and the second terminal, for monitoring a voltage of the secondary battery;
   a level shifter circuit for level-converting a voltage of a charge control signal output from the control circuit; and
   a third terminal for inputting the voltage subjected to the level-converting, and
   wherein the level shifter circuit comprises:
   a first transistor of a first conductivity type, including a gate connected to an input terminal of the level shifter circuit and a source connected to the first terminal;
   a first resistor including one terminal connected to the input terminal of the level shifter circuit;
   a second transistor of a second conductivity type, including a gate connected to another terminal of the first resistor, a drain connected to a drain of the first transistor, and a source connected to the third terminal; and
   a third transistor of the second conductivity type, including a gate and a drain connected to said another terminal of the first resistor, and a source connected to the third terminal.

2. A charge/discharge control circuit according to claim 1, wherein the level shifter circuit further comprises:
   a Zener diode including an anode connected to the drain of the first transistor and a cathode connected to the first terminal; and
   a second resistor connected between the drain of the first transistor and the drain of the second transistor.

3. A charge/discharge control circuit according to claim 1, wherein the level shifter circuit further comprises:
   a diode including a cathode connected to the drain of the first transistor and an anode connected to the second terminal; and
   a second resistor connected between the drain of the first transistor and the drain of the second transistor.

4. A battery device, comprising:
   a chargeable/dischargeable secondary battery;
   a charge/discharge control switch provided in a charge/discharge path of the chargeable/dischargeable secondary battery; and
   the charge/discharge control circuit according to claim 1, for monitoring a voltage of the chargeable/dischargeable secondary battery and controlling charge and discharge of the chargeable/dischargeable secondary battery by turning on and off the charge/discharge control switch.

* * * * *